(12) United States Patent
Hasler et al.

(10) Patent No.: US 11,210,435 B2
(45) Date of Patent: Dec. 28, 2021

(54) METHOD OF DESIGNING AND PRODUCING A TURBINE

(71) Applicant: Cummins Ltd, London (GB)

(72) Inventors: Craig S. T. Hasler, Huddersfield (GB); Vishal Seeburrun, Huddersfield (GB); Stephen David Hughes, Stockport (GB); Jamie Archer, W. Yorkshire (GB)

(73) Assignee: CUMMINS LTD, London (GB)

( * ) Notice: Subject to any disclaimer, the term of this patent is extended or adjusted under 35 U.S.C. 154(b) by 0 days.

(21) Appl. No.: 16/766,368

(22) PCT Filed: Nov. 21, 2018

(86) PCT No.: PCT/GB2018/053365
§ 371 (c)(1),
(2) Date: May 22, 2020

(87) PCT Pub. No.: WO2019/102190
PCT Pub. Date: May 31, 2019

(65) Prior Publication Data
US 2020/0380180 A1 Dec. 3, 2020

(30) Foreign Application Priority Data

Nov. 24, 2017 (GB) ..................... 1719581

(51) Int. Cl.
*B23P 15/00* (2006.01)
*G06F 30/17* (2020.01)
*F02B 37/02* (2006.01)

(52) U.S. Cl.
CPC ............ *G06F 30/17* (2020.01); *F02B 37/025* (2013.01); *B23P 15/00* (2013.01); *B23P 2700/13* (2013.01)

(58) Field of Classification Search
CPC ........ G06F 30/17; F02B 37/025; F02B 37/12; B23P 15/00; B23P 2700/13; Y02T 10/12;
(Continued)

(56) References Cited

U.S. PATENT DOCUMENTS 8,579,603 B2 * 11/2013 Oklejas ................... F04D 13/04
417/407
9,347,367 B2 * 5/2016 Nasir ...................... F01D 9/026
(Continued)

FOREIGN PATENT DOCUMENTS

CN 105275853 A 1/2016
DE 102015219459 B3 2/2017
(Continued)

OTHER PUBLICATIONS

Search Report issued by the United Kingdom Intellectual Property Office, dated Apr. 27, 2018, for related application GB1719581.9; 5 pages.
(Continued)

*Primary Examiner* — Lawrence Averick
(74) *Attorney, Agent, or Firm* — Faegre Drinker Biddle & Reath LLP

(57) ABSTRACT

A turbine with multiple gas inlets is designed by a process of, for a given engine, obtaining time series data characterizing the power bias of the engine, obtaining an isentropic power associated with each data point of the time series, and using the isentropic powers to obtain a design point. The turbine is then designed based on the design point, such as by optimising one or more design parameters of the turbine based on the design point.

11 Claims, 13 Drawing Sheets

(58) Field of Classification Search
CPC ...... F05D 2220/40; F02D 41/26; F02D 41/00; F02C 6/12
See application file for complete search history.

(56) References Cited

U.S. PATENT DOCUMENTS

| | | | |
|---|---|---|---|
| 9,617,931 B2* | 4/2017 | de Cesare | F02D 41/0007 |
| 10,451,087 B2* | 10/2019 | Richards | F04D 29/4226 |
| 2006/0013707 A1* | 1/2006 | Oklejas | F04D 29/628 |
| | | | 417/407 |
| 2009/0090106 A1 | 4/2009 | Muller | |
| 2015/0013332 A1* | 1/2015 | Nasir | F02B 37/004 |
| | | | 60/605.2 |
| 2015/0337747 A1* | 11/2015 | de Cesare | F02D 41/26 |
| | | | 701/102 |
| 2016/0003196 A1 | 1/2016 | Hang et al. | |
| 2016/0195109 A1* | 7/2016 | Richards | F02B 33/40 |
| | | | 60/602 |
| 2020/0300160 A1* | 9/2020 | Hughes | F01D 17/143 |
| 2020/0380180 A1 | 12/2020 | Hasler et al. | |

FOREIGN PATENT DOCUMENTS

| | | | |
|---|---|---|---|
| EP | 2930337 A1 | 10/2015 | |
| GB | 2017/053184 | * 2/2018 | |
| KR | 101679189 B1 | 11/2016 | |
| WO | 2018/073608 A1 | 4/2018 | |
| WO | WO-2018073608 A1 * | 4/2018 | ............ F02B 37/025 |

OTHER PUBLICATIONS

International Search Report and Written Opinion issued by the European Patent Office, dated Feb. 1, 2019 for International Application No. PCT/GB2018/053365; 8 pages.
International Preliminary Report on Patentability received for PCT Patent Application No. PCT/GB2018/053365, dated Jun. 4, 2020, 7 pages.

* cited by examiner

METHOD OF DESIGNING AND PRODUCING A TURBINE

CROSS-REFERENCE TO RELATED APPLICATIONS

The present application is a National Stage Application under 35 USC § 371 of PCT Application No. PCT/GB2018/053365, filed Nov. 21, 2018, which claims priority to U.K. Application No. 1719581.9, filed Nov. 24, 2017, the entire disclosures of which being hereby expressly incorporated herein by reference.

FIELD OF THE DISCLOSURE

The present disclosure relates to a method of identifying at least one design point for a turbine, and designing the turbine according to the design point. It further relates to a turbine produced by the design method, and a turbocharger including the turbine.

BACKGROUND OF THE DISCLOSURE

Turbomachines are machines that transfer energy between a rotor and a fluid. For example, a turbomachine may transfer energy from a fluid to a rotor or may transfer energy from a rotor to a fluid. Two examples of turbomachines are a power turbine, which uses the rotational energy of a rotor driven by a fluid to do useful work, for example, generating electrical power; and a compressor which uses the rotational energy of the rotor to compress a fluid.

Turbochargers are well known turbomachines for supplying air to an inlet of an internal combustion engine at pressures above atmospheric pressure (boost pressures). A conventional turbocharger essentially comprises an exhaust gas driven turbine wheel mounted on a rotatable shaft within a turbine housing connected downstream of an engine outlet manifold. Rotation of the turbine wheel rotates a compressor wheel mounted on the other end of the shaft within a compressor housing. The compressor wheel delivers compressed air to an engine inlet manifold.

The turbocharger shaft is conventionally supported by bearings such as journal and thrust bearings, including appropriate lubricating systems, located within a central bearing housing connected between the turbine and compressor wheel housings. After driving the turbine wheel the exhaust gas exits the turbine through a gas outlet which is at the opposite end of the rotational axis of the turbine wheel from the bearing housing.

It is well-known for the multiple cylinders of an internal combustion engine to be partitioned into two groups of cylinders, and for the exhaust gas emitted by the respective groups of cylinders to be transmitted into two respective gas inlets of a turbocharger. The gas inlets are in fluid communication with a chamber of the housing containing the turbine wheel via respective gas inlet volutes. The volutes are spaced from each other along the rotational axis of the turbine wheel, such that a first of the volutes is closer to the bearing housing (the "bearing housing side volute"—BH), and the other is closer to the turbine outlet side (the "turbine outlet side volute"—TO). The volutes may be circumferentially-spaced from each other about the rotational axis of the turbine wheel ("double-entry" volutes"), or axially-spaced but not circumferentially-spaced ("twin-entry" volutes). The term "full admission", or "equal admission", refers to the assumption that gas in both of the turbine entries have equal mass flow rates and pressures. However, the reality is that the two gas inlets in fact receive different mass flow rates and inlet pressures (a phenomenon called "partial admission"). Furthermore, flow entering each volute is unsteady, and the exhaust gas entering a first of the volutes may have different a pressure waveform from that of gas entering the other volute, which is furthermore out of phase with the pressure waveform of gas entering the first volute.

SUMMARY OF THE DISCLOSURE

In general terms, the disclosure proposes that a turbine with multiple gas inlets is designed by a process of, for a given engine, obtaining time series data characterizing the available turbine power at each gas inlet volute (which depends upon the bias of the engine between the groups of cylinders which feed exhaust gas into the respective gas inlet volutes), obtaining an isentropic power associated with each data point of the time series, and using the isentropic power of the data points to obtain a design point. The turbine is then designed based on the design point, such as by optimising one or more design parameters of the turbine based on the design point.

For example, the design point may be an isentropic-power weighted mean turbine expansion ratio, and a isentropic-power weighted mean scroll pressure ratio. Since the design point is selected based on isentropic-power weighted parameters, the design point is not unduly affected by points in the engine cycle at which the available power is low.

A different candidate design point may be obtained for each of the volutes, and then the design point is selected from among the candidate design points. Each candidate design point may be produced by filtering the time series data using a respective filter, and using the remaining points to generate the mean turbine expansion ratio and mean scroll pressure ratio.

For example, the filter for each volute may be such as to retain (e.g. only) data points for which a calculated scroll pressure ratio of the data point indicates that the scroll pressure is greater for that volute than for the other volute.

Once the design point has been obtained, there may be a step of determining whether the design point meets at least one pre-determined criterion indicating that high turbine power is delivered at equal flow. For example, the criterion may be whether the magnitude of a logarithm of a scroll pressure ratio associated with the design point is below a threshold. If the criterion is met, then optionally the turbine may be designed by a conventional process, i.e. without using the design point obtained using the isentropic power of the data points.

Otherwise, the design process may include one or more design steps, in each of which an optimization process is carried out in which one or more parameters of the turbine are iteratively varied based on the design point, thereby resulting in (candidate) turbine designs. The design steps may be computer assisted.

In an embodiment, the design process includes a first design step in which first parameters of the turbine are generated (i.e. a turbine is designed), for example by an optimisation process based on the design point. This optimization process may be performed multiple times, each time producing a respective candidate turbine design which has a respective value of the parameter "reaction". From the optimised designs, a reaction value is chosen, and the final turbine design has the chosen reaction value. Optionally, in a second design step, parameters of the turbine are generated (i.e. a final turbine design is produced) by an optimization process based on the design point and the chosen reaction value.

Here the parameter "reaction" is conventionally defined as the change of enthalpy in the turbine rotor blades compared to the overall change of enthalpy in the turbine. Reaction is measure of how much gas expansion occurs in the turbine wheel relative to the total turbine stage (housing plus wheel). A low reaction signifies that there is a relatively large wheel (exducer) and a relatively small housing, while a high reaction indicates that there is a small wheel (exducer) and relatively large housing. The two-step design process means that a reaction associated with relatively high efficiency may be selected, and then the turbine designed with that reaction as a constraint.

The reaction may alternatively be expressed as a ratio ($CA_{housing}/CA_{wheel}$) of a critical area $CA_{housing}$ of the housing, and a critical area $CA_{wheel}$ of the turbine wheel. The critical area of the housing, $CA_{housing}$, is the cross-sectional area of the volutes measured at a plane that intersects the rotational axis of the turbocharger where the combined cross-sectional area of the volutes is at its smallest, upstream of the opening into the chamber. The critical area of the wheel, $CA_{wheel}$, is defined as the smallest area along the meridional length of the wheel (that is, along the flow path defined between the blades) transverse to the flow path. This is usually located in the exducer of the wheel.

Accordingly, in the first design step, each optimization process may be performed using a respective value of the ratio ($CA_{housing}/CA_{wheel}$), which is kept constant during the optimization process. Similarly, the step of choosing the reaction value amounts to a selection of a value for the ratio ($CA_{housing}/CA_{wheel}$), and the second design step is performed by an optimization process which does not vary the selected ratio ($CA_{housing}/CA_{wheel}$).

An independent aspect of the disclosure is a process of designing a turbine comprising (i) obtaining a design point, (ii) for each of a plurality of reaction values, designing a candidate turbine using the design point, and (iii) selecting a reaction value from among the plurality of reaction values, the final turbine design using the selected reaction value. It is not necessary to this expression of the disclosure that the design point is selected based on isentropic power values.

BRIEF DESCRIPTION OF THE DRAWINGS

A non-limiting embodiment of the disclosure will now be described, for the sake of example only, with reference to the following figures, in which.

DETAILED DESCRIPTION OF THE EMBODIMENTS

Figure 1:
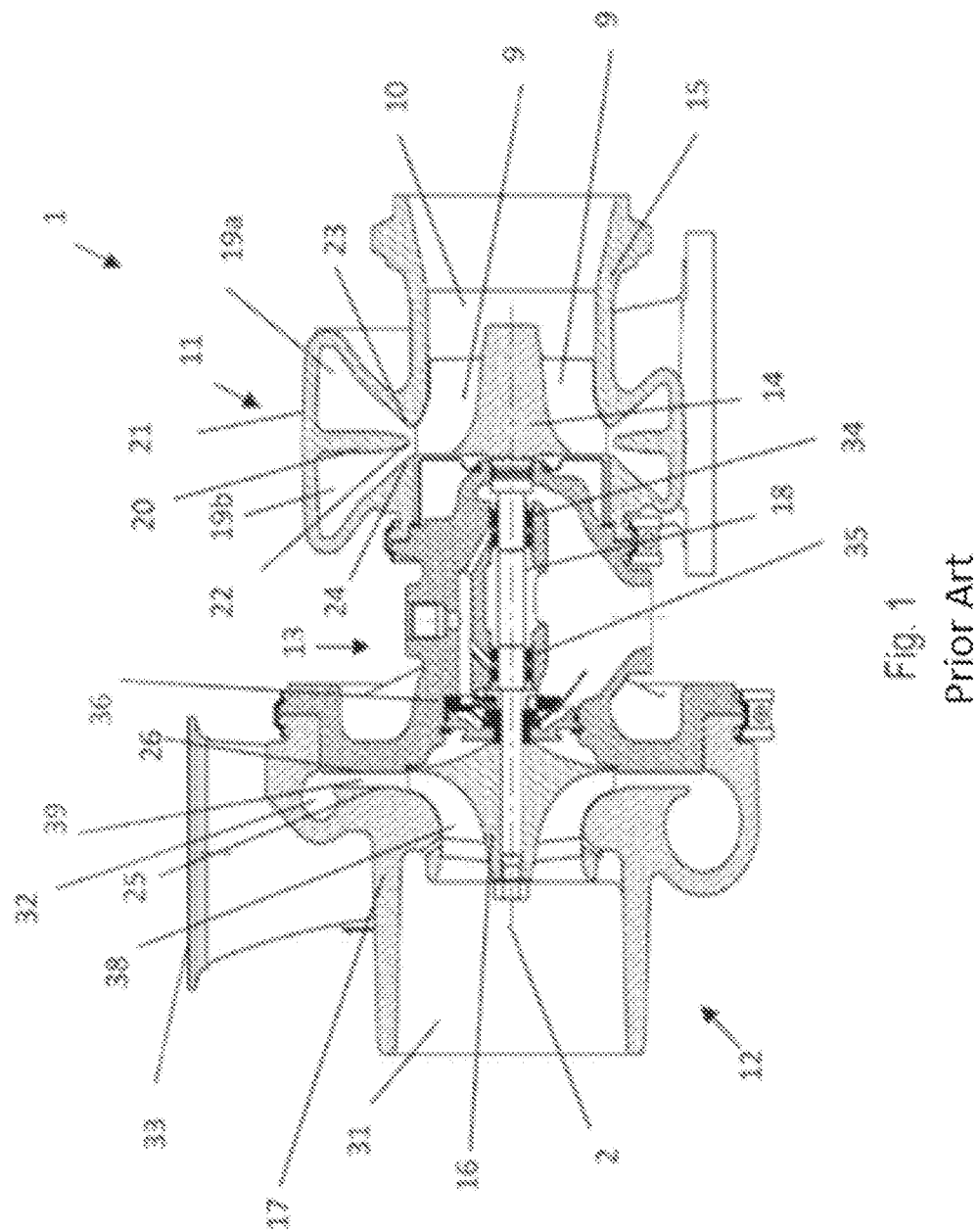
FIG. 1 is a cross-sectional drawing of a known turbocharger.

FIG. 1 shows a schematic cross-section through a known turbocharger 1. The turbocharger 1 comprises a turbine 11 joined to a compressor 12 via a central bearing housing 13. The turbine 11 comprises a turbine wheel 14 for rotation within a turbine housing 15. The turbine wheel 14 has a rotational axis 2 (in the plane of the diagram) and blades 9. Similarly, the compressor 12 comprises a compressor wheel 16 (or "impeller") which can rotate within a compressor housing 17. The compressor housing 17 defines a compressor chamber 38 which is largely filled by the compressor wheel 16, and within which the compressor wheel 16 can rotate. The turbine wheel 14 and compressor wheel 16 are mounted on opposite ends of a common turbocharger shaft 18 which extends through the central bearing housing 13. The turbocharger shaft 18 is rotatably supported by a bearing assembly in the bearing housing 13 which comprises two journal bearings 34 and 35 housed towards the turbine end and compressor end respectively of the bearing housing 13. The bearing assembly further includes a thrust bearing 36.

The turbine housing 15 has two exhaust gas inlet volutes 19a, 19b located annularly around the turbine wheel 14, and an axial exhaust gas outlet 10. The volutes 19a, 19b are symmetrical with respect to each other in a mirror plane perpendicular to the axial direction (note that in other known turbine housings the volutes are not symmetrical; furthermore in "double entry" turbines the volutes are circumferentially spaced, such as by 180 degrees, about the rotational axis 2 of the turbine). The compressor housing 17 has an axial air intake passage 31 and a volute 32 arranged annularly around the compressor chamber 38. The volute 32 is in gas flow communication with a compressor outlet 33. The compressor chamber 38 is connected to the volute 32 by a radially-extending diffuser space 39 (also referred to here as a "diffuser") which is a gap between a radially-extending shroud surface 25 of the housing 17, and a radially extending hub surface 26 of the bearing housing 13. The diffuser 39 is rotationally symmetric about the rotational axis 2 of the shaft 18.

In use, exhaust gas is provided to the two exhaust gas inlet volutes 19a, 19b from an exhaust manifold (also referred to as an outlet manifold) of the engine (not shown) to which the turbocharger is attached. The inlet volutes 19a, 19b are divided by a divider wall 20 which extends radially inwardly from the radially outer wall 21 of the turbine housing 15, to a tip 22. The exhaust gas exits the inlet volute 19a through a gap between the tip 22 of the divider wall 20 and a first shroud surface 23 of the turbine 11. The exhaust gas exits volute 19b through a gap between the tip 22 of the divider wall 20 and a second shroud surface 24 of the turbine 11. Thus, the exhaust gas passes from the exhaust gas inlet volutes 19a, 19b to the exhaust gas outlet 10 via a turbine wheel 14, which is rotated by the exhaust gas. In variants, the second shroud 24 surface may be provided as a surface of the bearing housing or some other component, instead of being a surface of the turbine housing 15.

The turbine wheel 14 in turn rotates the compressor wheel 16 which thereby draws intake air through the compressor inlet 31 and delivers boost air to an inlet manifold of the engine via the diffuser 39, the volute 32 and then the outlet 33.

Figure 2:
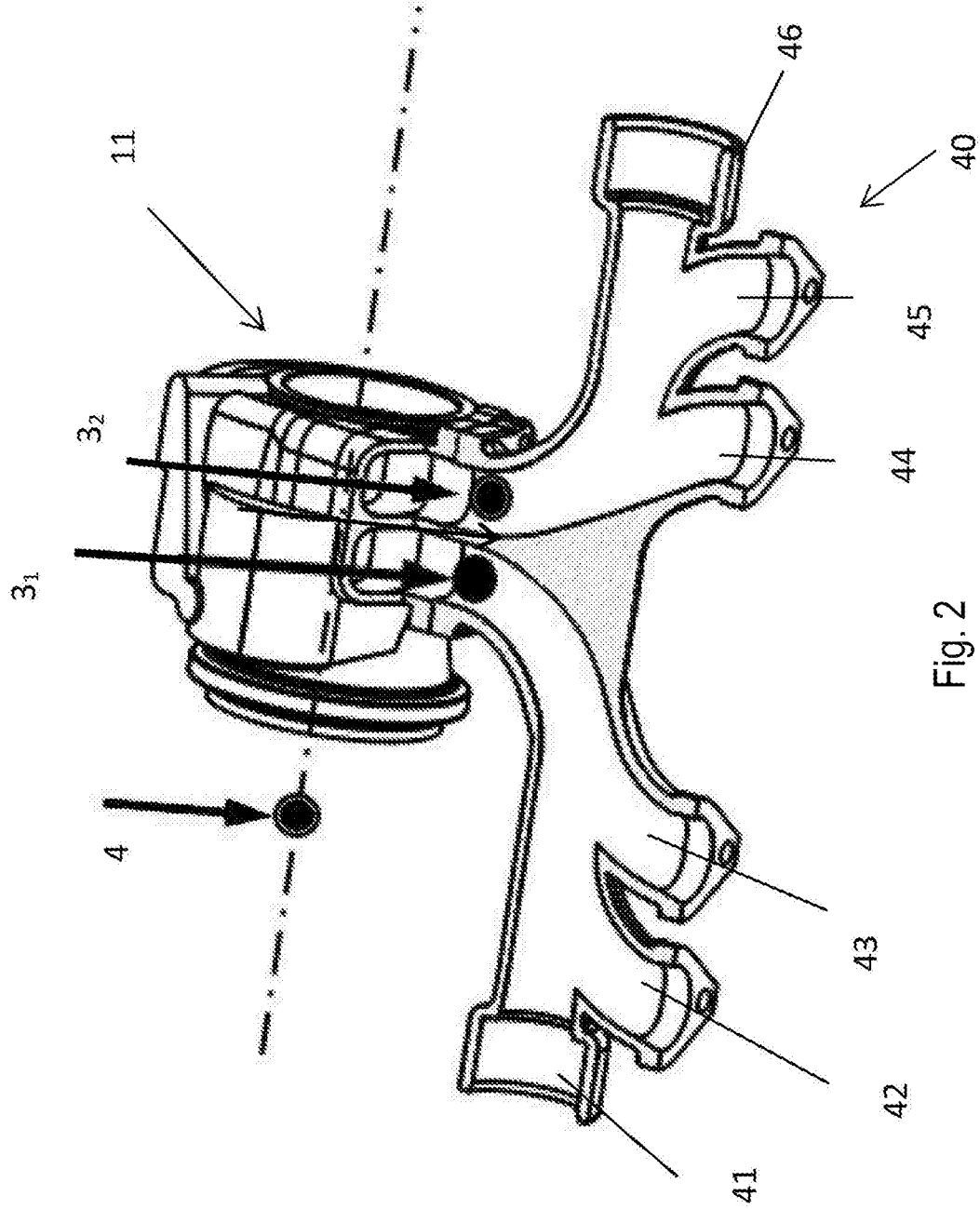
FIG. 2 illustrates how a turbine of the turbocharger of FIG. 1 is conventionally connected to an engine manifold of an internal combustion engine.

FIG. 2 shows the turbine 11 in use (the rest of the turbocharger 1 is omitted), connected to the engine manifold 40 of an engine. A TO (turbine outlet) gas inlet of the turbine 11 in fluid communication with the gas inlet volute 19a is denoted $3_1$, and a BH (bearing housing) gas inlet of the turbine 11 in fluid communication with the gas inlet volute 19b is denoted $3_2$. The engine manifold includes passages 41, 42, 43 for transmitting exhaust gas from a first group of three cylinders of the engine to the gas inlet $3_1$ of the turbine 11, and passages 44, 45, 46 for transmitting exhaust gas from a first group of three cylinders of the engine to the gas inlet $3_2$ of the turbine 11. The reference numeral 4 denotes the turbine outlet.

It is known that through a combustion cycle, the flow entering the exhaust gas inlet volutes 19a, 19b varies. We use the following notation. A quantity with a superscript dot (e.g. $\dot{p}$) denotes a variable which takes a respective value at each of a number of respective angular positions of the turbine wheel (e.g. a respective value at angular positions spaced apart by, for example, one degree), also referred to as the crank angle. Such a quantity must be measured (or calculated) at high frequency. By contrast, a quantity with a superscript dash (e.g. $\bar{p}$) denotes a quantity which is averaged over the rotational period of the turbine wheel (i.e. over the cycle). A quantity with a subscript 1, or 3,1, denotes a quantity measured at the gas inlet $3_1$, whereas a quantity with a subscript 2, or 3,2, denotes a quantity measured at the gas inlet $3_2$. A quantity with a subscript 4 denotes a quantity measured at the turbine gas outlet 4.

Figure 3:
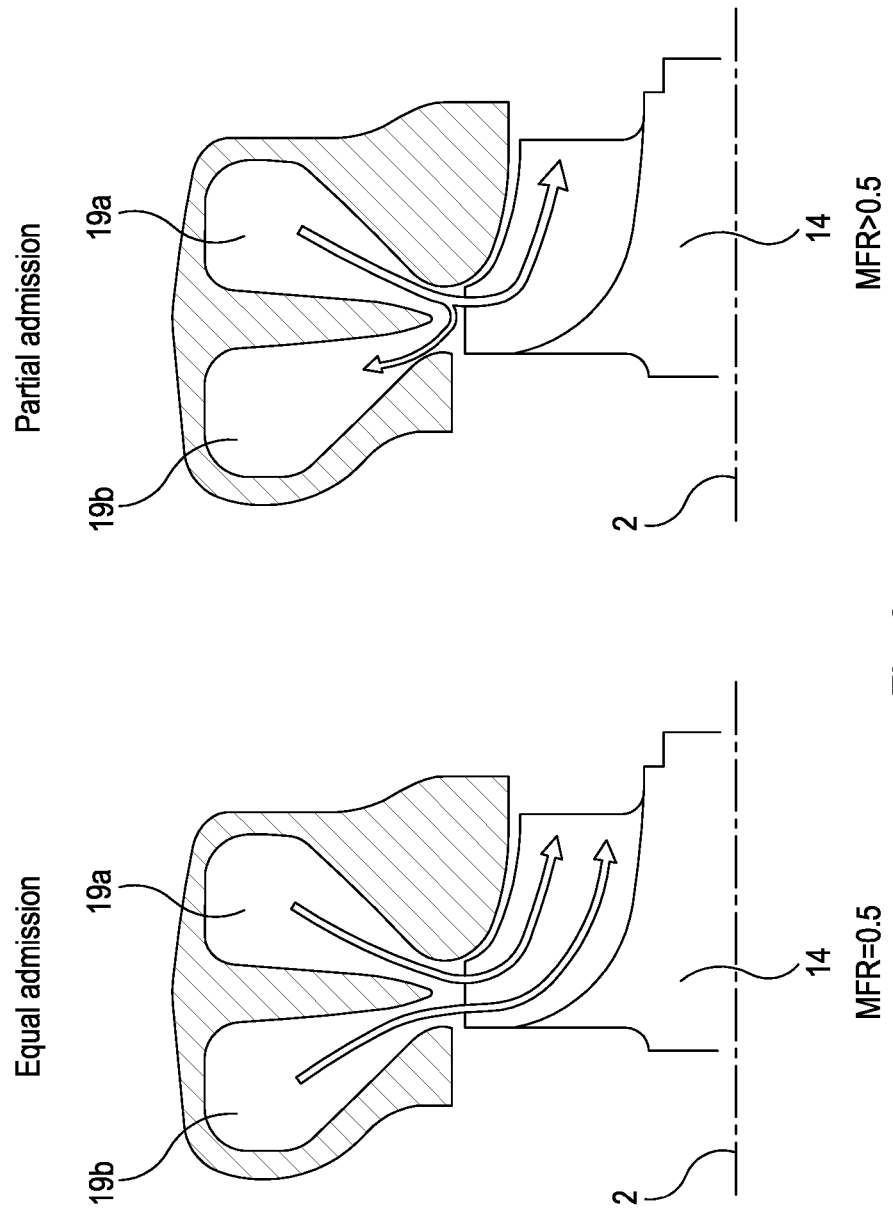
FIG. 3, which is composed of FIGS. 3(a) and 3(b), illustrates equal and partial admission of exhaust gas into two gas inlets of the turbine of the turbocharger of FIG. 1.

FIG. 3(a) illustrates the flow from the volutes 19a, 19b towards the turbine wheel 14 when the pressures in the volutes 19a, 19b are equal. The mass flow ratio (MFR) is defined (at any instant) as $$\frac{\dot{m}_{ex,1}}{\dot{m}_{ex,1} + \dot{m}_{ex,2}}$$

where $\dot{m}_{ex,1}$ is the mass which flows along volute 19a per second, and $\dot{m}_{ex,2}$ is the mass which flows along volute 19b per second. An MFR of 0.5 means that both volutes are contributing equally to the mass flow.

However, a situation in which the pressures in the volutes 19a, 19b are not equal is referred to as "partial admission". FIG. 3(b) illustrates what occurs when there is a pressure pulse in the volute 19a which means that the pressure is higher than in the volute 19b. Exhaust gas from the volute 19a not only passes towards the turbine wheel 14, but also passes to the volute 19b ("recirculation"). Thus the high pressure volute 19a has completely blocked the low pressure volute 19b, and MFR is greater than one. The recirculation causes energy losses.

We use the following abbreviations:
P Pressure. Thus
T Temperature
ER Turbine expansion ratio
SPR Scroll Pressure ration
Pi Turbine Expansion Ratio
$\dot{W}_t(T)$ Turbine Power
$\dot{m}_{ex}$ Exhaust mass flow rate
° CA The crank angle (measured in degrees)

Figure 4:
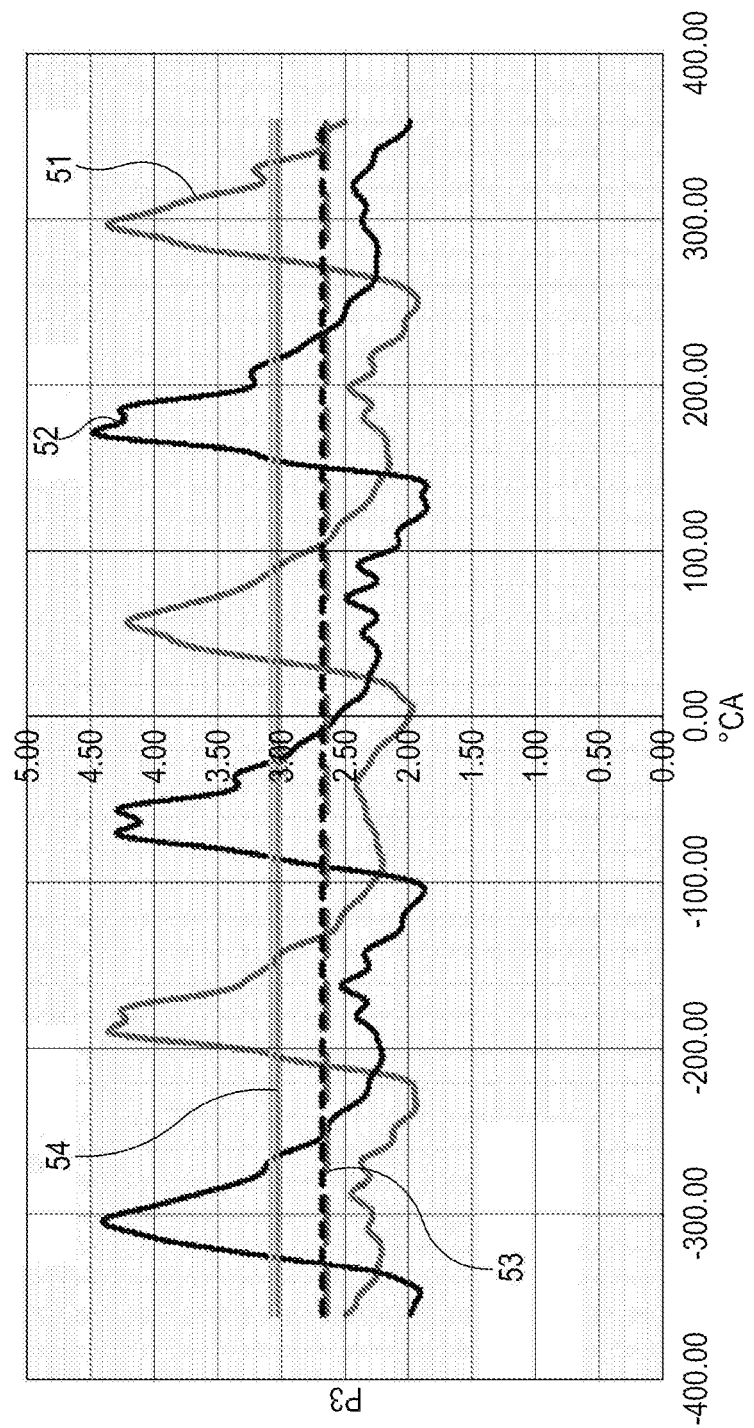
FIG. 4 illustrates the time-variation of gas pressures at the gas inlets of the turbine of the turbocharger of FIG. 1.

Thus, the pressure at the gas inlet 31 is $\dot{P}_{3,1}$, while the pressure at the gas inlet 32 is $\dot{P}_{3,2}$. FIG. 4 is a plot of time series data composed of data points collectively indicating the variation over engine cycles of $\dot{P}_{3,1}$ (line 51) and $\dot{P}_{3,2}$ (line 52). The respective time-averaged values of these pressures are almost identical and are indicated as line 53. This time-averaged value depends upon the data points (which in turn depend on the engine operating point which depends on the fuel conditions) and the averaging method and line 54 indicates an average value of the time-average pressure at the gas inlets, as measured by a dynamometer of the engine. For various reasons, the value measured by the dynamometer is typically inaccurate. The data measured on the dynamometer typically uses pressure measuring instruments mounted at the end of a long pressure measurement line. The line attenuates the pressure signal hence the 'mechanical averaged' p3 is lower than the time average of the instantaneous data (taken with a close coupled transducer)

The expansion ratios (ER) are defined as follows:

$$\dot{E}R_1 = \frac{\dot{P}_{3,1}}{\overline{P}_4} \text{ and } \dot{E}R_2 = \frac{\dot{P}_{3,2}}{\overline{P}_4} \quad (1)$$

where $\overline{P}_4$ is the time-averaged pressure at the outlet 4. Note that in an alternative, $\overline{P}_4$ may be replaced by $\dot{P}_4$ in this definition.

The (instantaneous) scroll pressure ratio (SṖR) is defined as the ratio of the turbine inlet pressures, which can be calculated either from partial admission maps or on-engine data by high-speed data acquisition (HSDA).

$$S\dot{P}R = \frac{\dot{P}_{3,1}}{\dot{P}_{3,2}} \quad (2)$$

Typically, diagrams of this parameter are plotted using the logarithmic parameter $\log_{10}$ (SṖR), in order for the scale to be symmetric between the two volutes.

The (instantaneous) turbine inlet expansion ratio is defined as:

$$\dot{P}_t = \frac{\dot{E}R_1 + \dot{E}R_2}{2} \quad (3)$$

Figure 5:
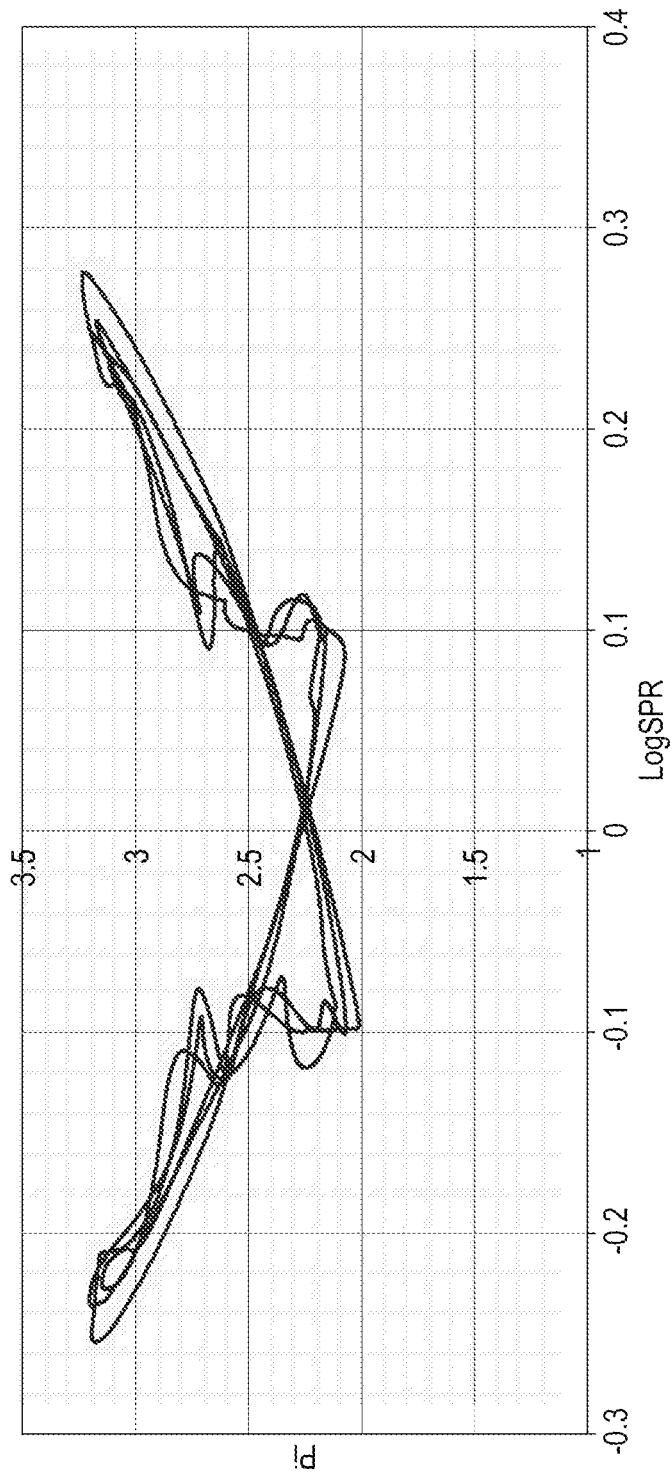
FIG. 5 is a plot of turbine expansion ratio and scroll pressure ratio for an engine cycle of a typical internal combustion engine.

It is known to plot the respective values $\dot{P}_t$ against SṖR over a cycle, giving a diagram such as that shown in FIG. 5.

D. Luckmann, et al., "*Advanced Measurement and Modeling Methods for Turbochargers*", MTZ 0612016 *Volume 77* includes a plot of the efficiency of a conventional twin-entry turbine for various values of values $\dot{P}_t$ against $\dot{SPR}$. The efficiency is not symmetrical with respect to $\log_{10}$ ($\dot{SPR}$), but instead is typically higher when $\log_{10}$ ($\dot{SPR}$) is negative (i.e. the pressure is greater in the BH gas inlet volute than in the TO gas inlet volute) than when it is positive.

Figure 6:
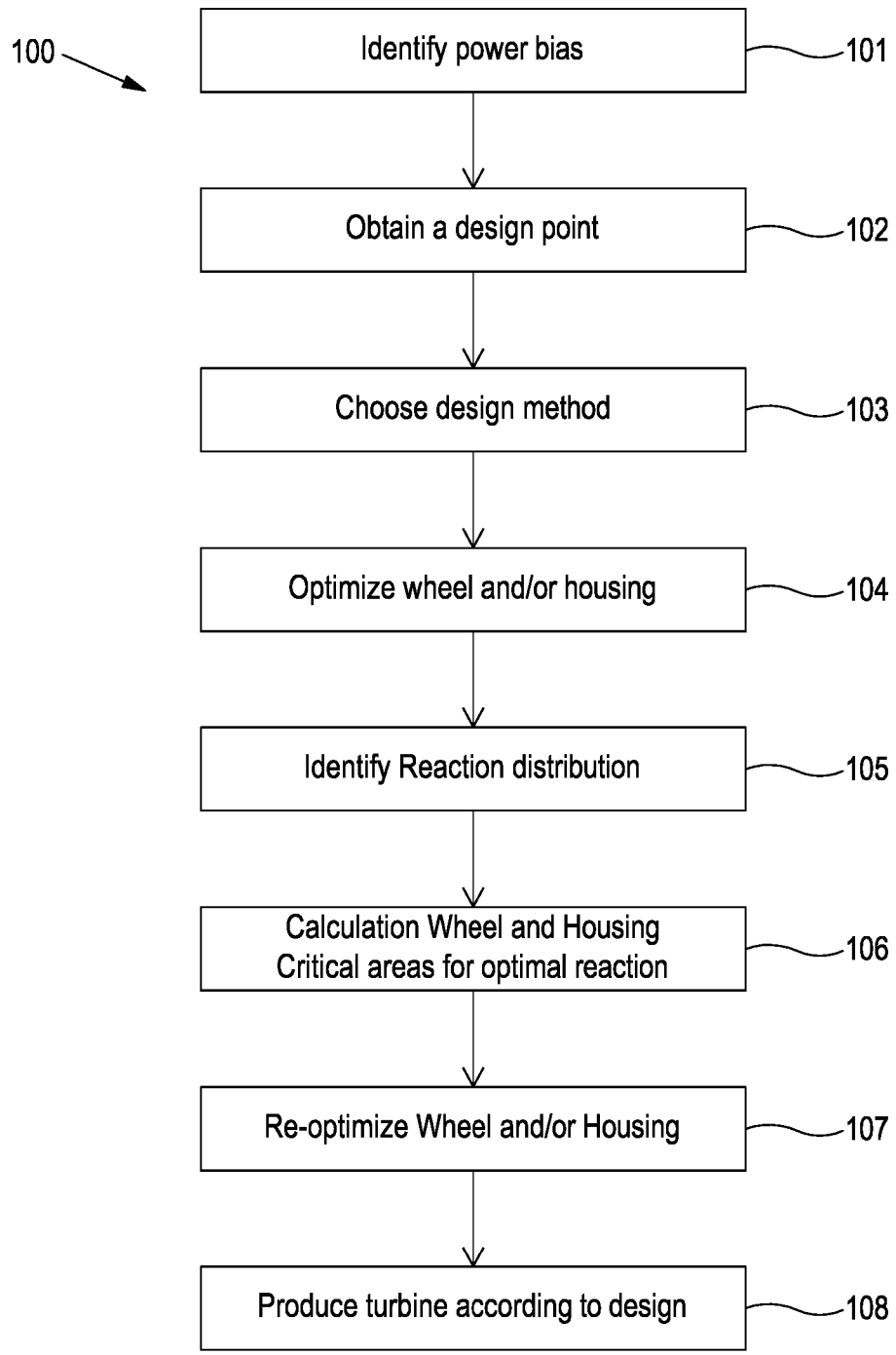
FIG. 6 shows steps of a method which is an embodiment of the present disclosure.

Turing to FIG. 6, a method 100 which is an embodiment of the present disclosure is shown. The embodiment is for designing and producing a turbine for a real engine of a specific type, such as the one which generated the plot of FIG. 5. Considering the known plot discussed above of the efficiency of a twin-entry turbine for various values of $\dot{P}_t$ and $\dot{SPR}$, the embodiment's design strategy can be summarized as designing the turbine such that the regions in the $\dot{P}_t$-$\dot{SPR}$ plane for which the designed turbine has high efficiency coincide with the measured trajectory illustrated in FIG. 5. To simplify the design algorithm, the trajectory of FIG. 5 is "distilled" into a small number of representative "design points" in the $\dot{P}_t$-$\dot{SPR}$ plane, and the turbine is designed to have high efficiency for those design points.

In step 101 of the method 100, the isentropic turbine power bias of the real engine is identified. Step 101 is performed by measuring $\dot{P}_{3,1}$ and $\dot{P}_{3,2}$ at high frequency (typically 12 to 120 kHz depending on engine speed and resolution required), and converting this time-series of data points into desired quantities as follows using mean (i.e. time-averaged over the engine cycle) quantities which are available from a supplier of the engine and/or are measured at low frequency, such as $T_{3,1}$, $T_{3,2}$, $\overline{P_4}$, $\overline{m}_{ex,1}$ and $\overline{m}_{ex,2}$. Note that in a variation of the embodiment, the measured data may be different. For example, high frequency data $\dot{P}_4$ may be obtained and used instead of the mean value $\overline{P_4}$.

In step 102, a design point is obtained as follows.

The respective turbine isentropic powers for the gas inlets 19a and 19b, for any given crank angle, are defined as:

$$\dot{W}_{t,1,is} = \dot{m}_{ex,1} \times c_p \times \dot{T}_{3,1} \times \left(1 - \left(\frac{1}{ER_1}\right)^{\frac{\gamma-1}{\gamma}}\right) \quad (4)$$

$$\dot{W}_{t,2,is} = \dot{m}_{ex,2} \times c_p \times \dot{T}_{3,2} \times \left(1 - \left(\frac{1}{ER_2}\right)^{\frac{\gamma-1}{\gamma}}\right), \quad (5)$$

where $c_p$ is the specific heat capacity of the exhaust gas. Eqns. (4) and (5) indicate the total available power which the turbine could in principle generate using the exhaust of the real engine, rather than what the turbine actually recovers, which is a function of the design of the turbine.

$\dot{ER}_1$ and $\dot{ER}_2$ are calculated straightforwardly using Eqn. (1) and the time-series of data points. Note that in a variant of the embodiment, if high frequency data $\dot{P}_4$ is available, Eqn. (1) may be calculated by using $\dot{P}_4$ instead of the mean value $\overline{P_4}$.

Figure 7:
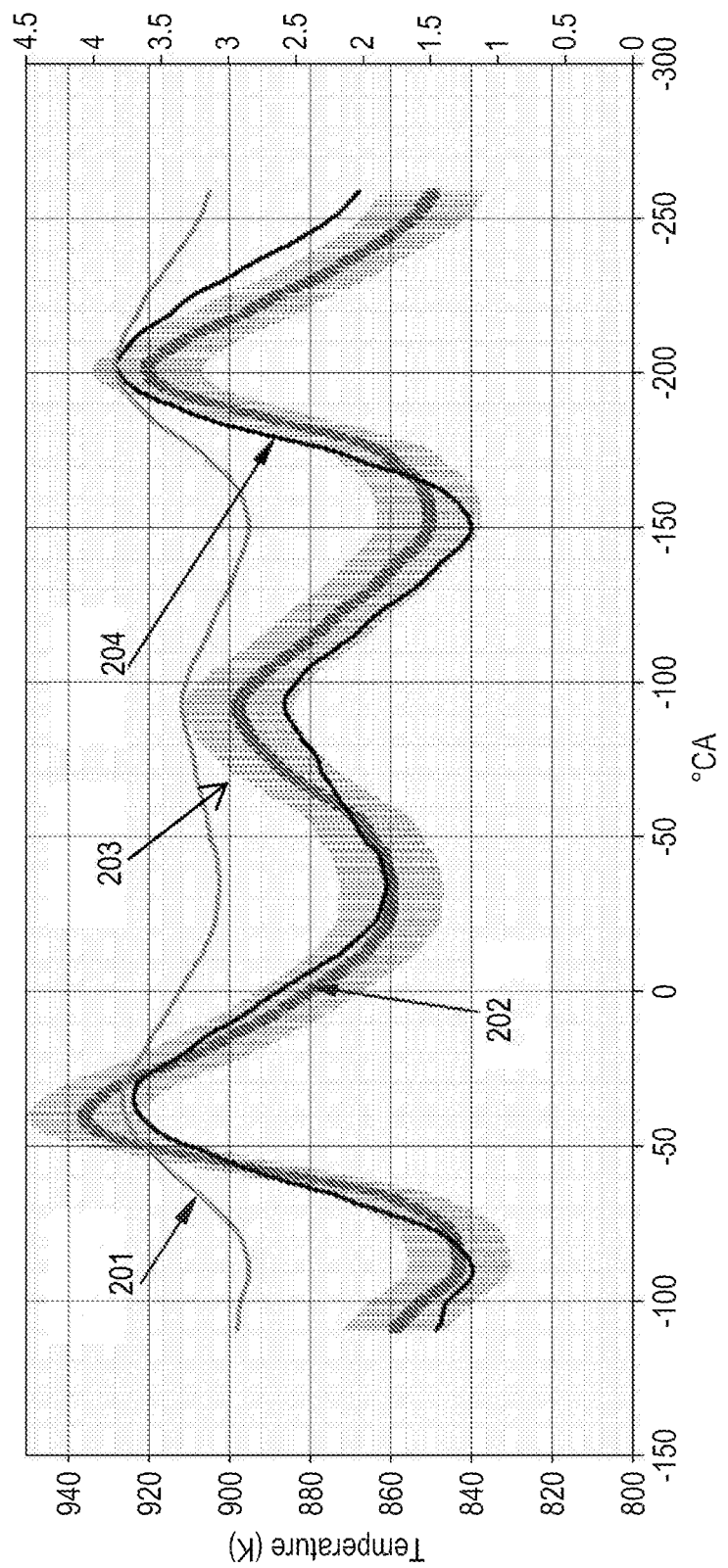
FIG. 7 illustrates the accuracy of a first numerical estimate employed by the embodiment.

Instantaneous measurements of $\dot{T}_{3,1}$ and $\dot{P}_{3,2}$ may be hard to obtain at high frequency, but from the ideal gas law we obtain, for an ideal gas:

$$\frac{\dot{T}_{3,1}}{\overline{T}_{3,1}} = \left(\frac{\dot{P}_{3,1}}{\overline{P}_{3,1}}\right)^{\frac{\gamma-1}{\gamma}}, \quad (6)$$

where $\gamma$ is the polytropic index of the gas. In a real gas, we would expect the polytropic index to be greater than $\gamma$. We have found, from a one-dimensional engine numerical simulation illustrated in FIG. 7, that the expression $$\frac{\dot{T}_{3,1}}{\overline{T}_{3,1}} = \left(\frac{\dot{P}_{3,1}}{\overline{P}_{3,1}}\right)^{\frac{n-1}{n}} \quad (7)$$

is well obeyed for a value of n of 1.5. In FIG. 7, line 201 indicates the time-profile of the instantaneous pressure at the output of a simulated engine. Line 202 is the simulated instantaneous temperature of the gas, and area 203 indicates a ±1.5% error around this value. Line 204 is obtained from Eqn. (7) using n=1.5. Line 204 tracks line 202 to within the error margin indicated by area 203.

The instantaneous mass flow rate $\dot{m}_{ex,1}$ and $\dot{m}_{ex,2}$ are also difficult to measure exactly, but they can be expressed as:

$$\dot{m}_{ex,1} = C_d A_1 \dot{P}_{3,1} \sqrt{\frac{\gamma}{R\dot{T}_{3,1}} \cdot \left(\frac{2}{\gamma+1}\right)^{\frac{\gamma+1}{\gamma-1}}} \quad \text{and} \quad (8)$$

$$\dot{m}_{ex,2} = C_d A_2 \dot{P}_{3,2} \sqrt{\frac{\gamma}{R\dot{T}_{3,2}} \cdot \left(\frac{2}{\gamma+1}\right)^{\frac{\gamma+1}{\gamma-1}}}.$$

Here $A_1$ and $A_2$ are the respective critical areas of the gas inlet volutes. That is, $CA_{housing}=A_1+A_2$. $C_d$ is a parameter called the "discharge coefficient".

Thus, by approximating $\gamma$ as above by n=1.5, and using values for Cd and R given in standard tables, $\dot{m}_{ex,1}$ and $\dot{m}_{ex,2}$ can be calculated for any crank angle using Eqn. (8).

Note that $C_d$ may not be not known in advance. If not, it can be worked out by an iterative process. First, we assume a value for $C_d$, work out what value this would imply for $\dot{m}_{ex,1}$, then find the mean of $\dot{m}_{ex,1}$ over time, and compare it to the known value of $\overline{m}_{ex,1}$. If the two are different, the $C_d$ is varied. This process is carried out iteratively until the two are the same. In a case in which $\overline{m}_{ex,1}$ is not available, but $\overline{m}_{ex}=\overline{m}_{ex,1}+\overline{m}_{ex,2}$ is known, the embodiment first finds $\overline{m}_{ex,1}$ and $\overline{m}_{ex,2}$ from $\overline{m}_{ex}$ by assuming that $$\frac{\overline{m}_{ex,1}}{\overline{m}_{ex,2}} = \overline{SPR},$$

and then uses $\overline{m}_{ex,1}$ or $\overline{m}_{ex,2}$ in the iterative process.

Figure 8:
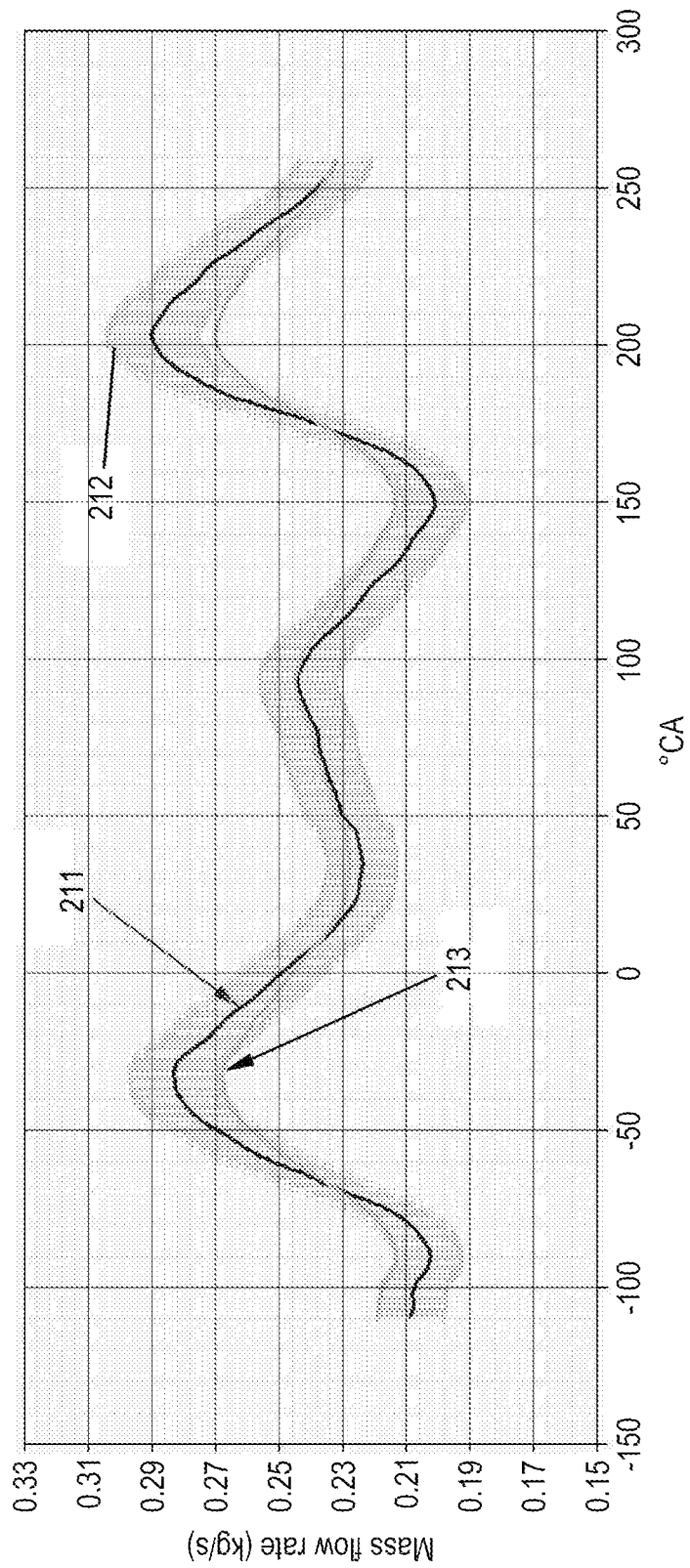
FIG. 8 illustrates the accuracy of a second numerical estimate employed by the embodiment.

The accuracy of this approach is demonstrated in FIG. 8. In FIG. 8, line 211 indicates the time-profile of the instantaneous mass flow rate output of a simulated engine, and area 212 indicates a ±1.5% error around this value. Line 213 is obtained from Eqn. (8), and tracks line 211 to within the error margin indicated by area 212.

Figure 9:
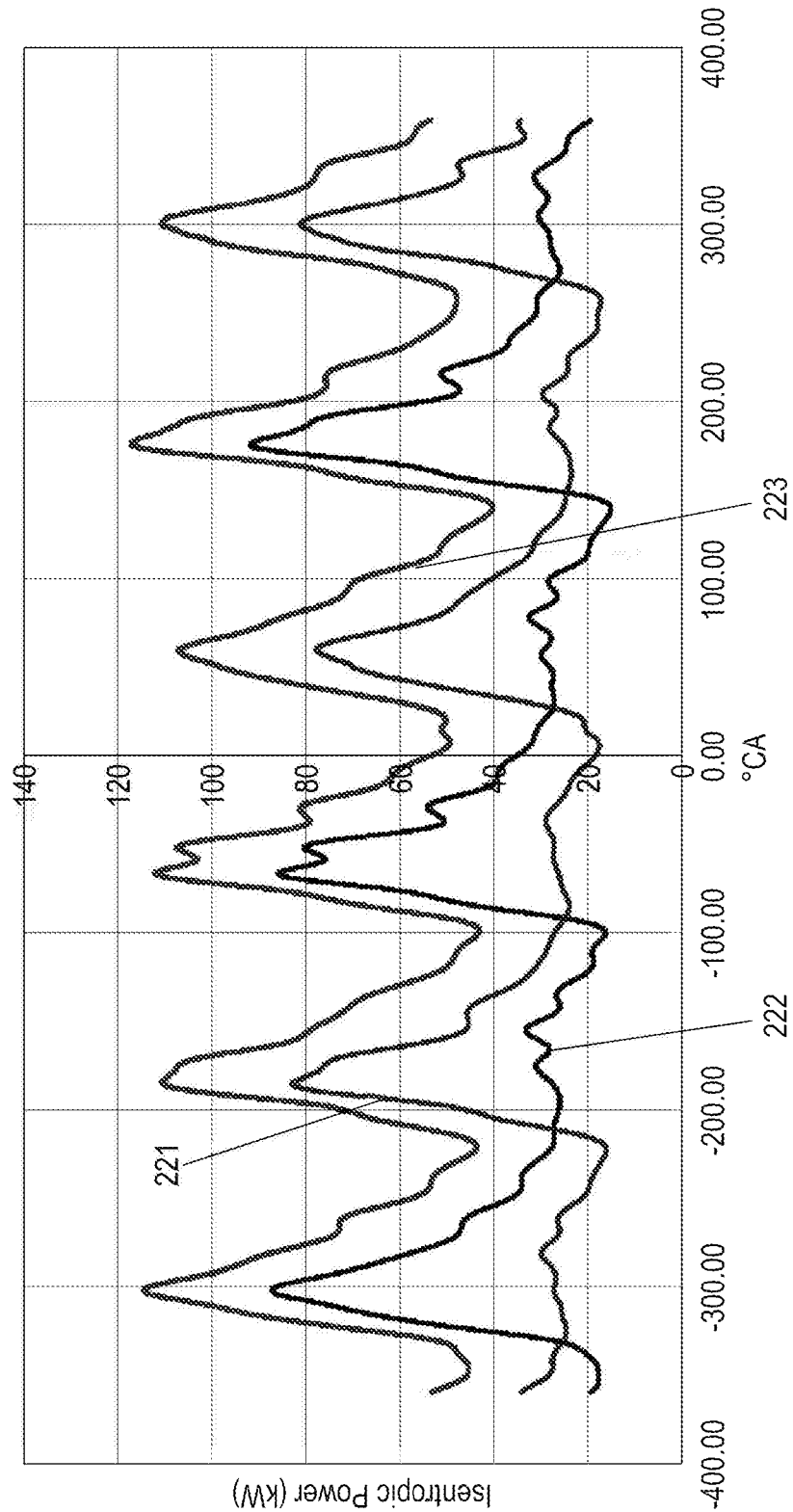
FIG. 9 illustrates numerical values produced by the embodiment of the disclosure.

Inserting the calculated values of $\dot{ER}_1$, $\dot{ER}_2$, $\dot{T}_{3,1}$, $\dot{T}_{3,2}$, $\dot{m}_{ex,1}$ and $\dot{m}_{ex,2}$ into Eqn. (4) and (5), gives the values of $\dot{W}_{t,1,is}$ and $\dot{W}_{t,2,is}$ illustrated by lines 221 and 222 in FIG. 9. Their sum, which is the total turbine isentropic power, is illustrated by line 223.

Figure 10:
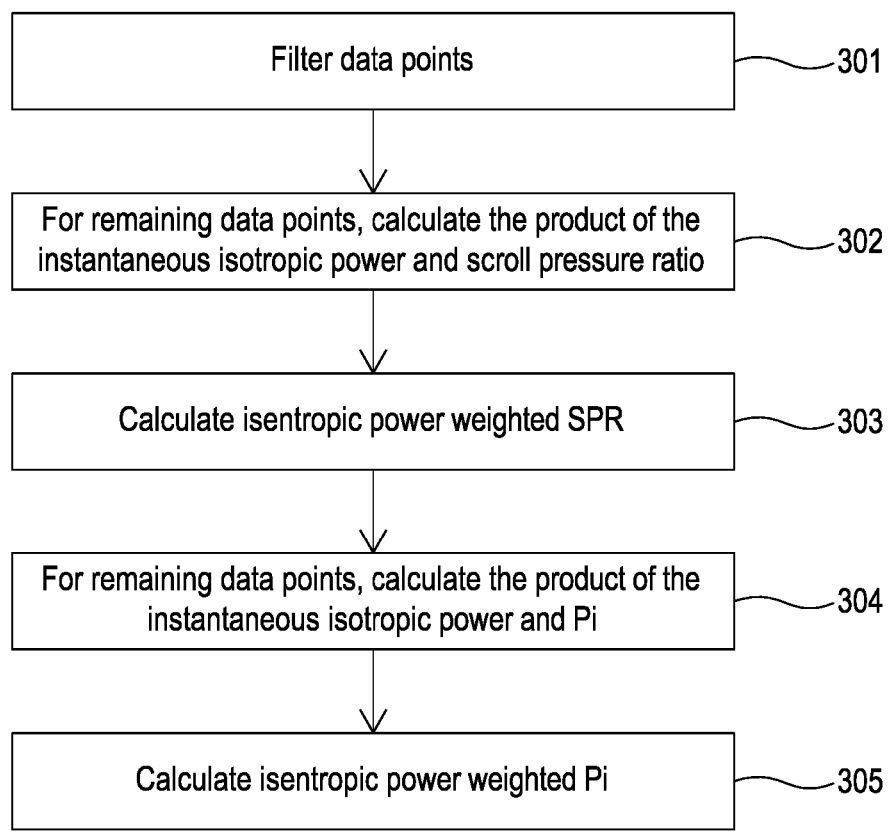
FIG. 10 illustrates a process for obtaining a design point for a gas inlet volute in the embodiment.

Respective candidate design points for each of the volutes 19a, 19b are calculated as follows. For each of the volutes, the sub-steps illustrated in FIG. 10 are performed to generate the respective candidate design point.

Figure 11:
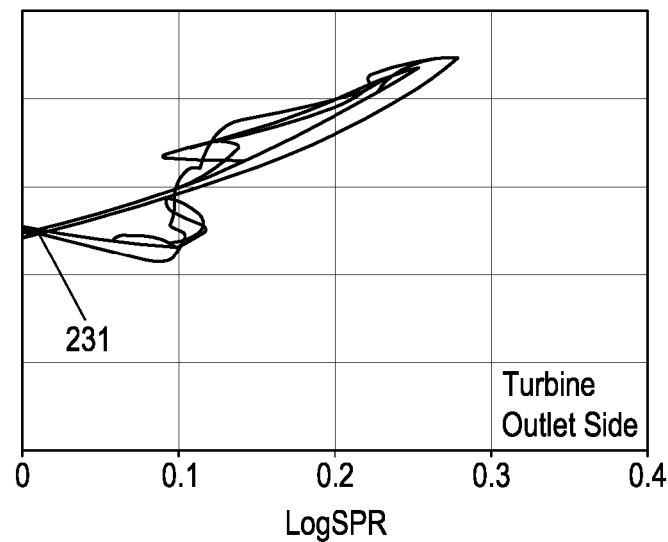
FIG. 11 illustrates schematically how data points are filtered by the embodiment.

In a first sub-step 301, the data points for the real engine illustrated in FIG. 5 are filtered. The filter is different for each of the volutes 19a, 19b. For the volute 19a on the turbine outlet side, the filter retains only the data points for which $\log_{10}$ (SṖR) is greater than zero. For the volute 19b on the bearing housing side only the data points for which $\log_{10}$ (SṖR) is less than zero are retained. FIG. 11 illustrates the data points remaining for the turbine outlet side volute following this filtering operation. Note that the remaining data points include the mid-point 231 on the SPR interaction plot, because it is not exactly on the $\log_{10}$ (SṖR)=0 axis.

In sub-step 302, for each of the filtered (i.e. remaining) data points, the product is calculated of the respective instantaneous isentropic power for the volute (i.e. $\dot{W}_{t,1,is}$ or $\dot{W}_{t,2,is}$ respectively) and the respective scroll pressure ratio SṖR.

In sub-step 303, an isentropic power weighted mean SPR is calculated, by:

$$\text{isentropic power weighted mean } SPR = \frac{\Sigma S\dot{P}R \times \text{Isentropic Power}}{\Sigma \text{ Isoentropic power}}, \quad (9)$$

where in each case the sum is over the filtered data points, and "Isentropic power" refers to $\dot{W}_{t,1,is}$ or $\dot{W}_{t,2,is}$ respectively.

In sub-step 304, for each of the filtered data points, the product is calculated of the respective instantaneous isentropic power for the volute (i.e. $\dot{W}_{t,1,is}$ or $\dot{W}_{t,2,is}$ respectively) and the respective turbine expansion ratio $\dot{P}_t$.

In sub-step 305, the isentropic power weighted mean Pi is calculated, by:

$$\text{isentropic power weighted mean } Pi = \frac{\Sigma \dot{P}t \times \text{Isentropic Power}}{\Sigma \text{ Isoentropic power}}, \quad (10)$$

where in each case the sum is over the filtered data points, and "Isentropic power" refers to $\dot{W}_{t,1,is}$ or $\dot{W}_{t,2,is}$ is respectively.

For each gas inlet volute 19a, 19b, the candidate design point is the isentropic power weighted mean Pi and the isentropic power weighted mean SPR.

Figure 12:
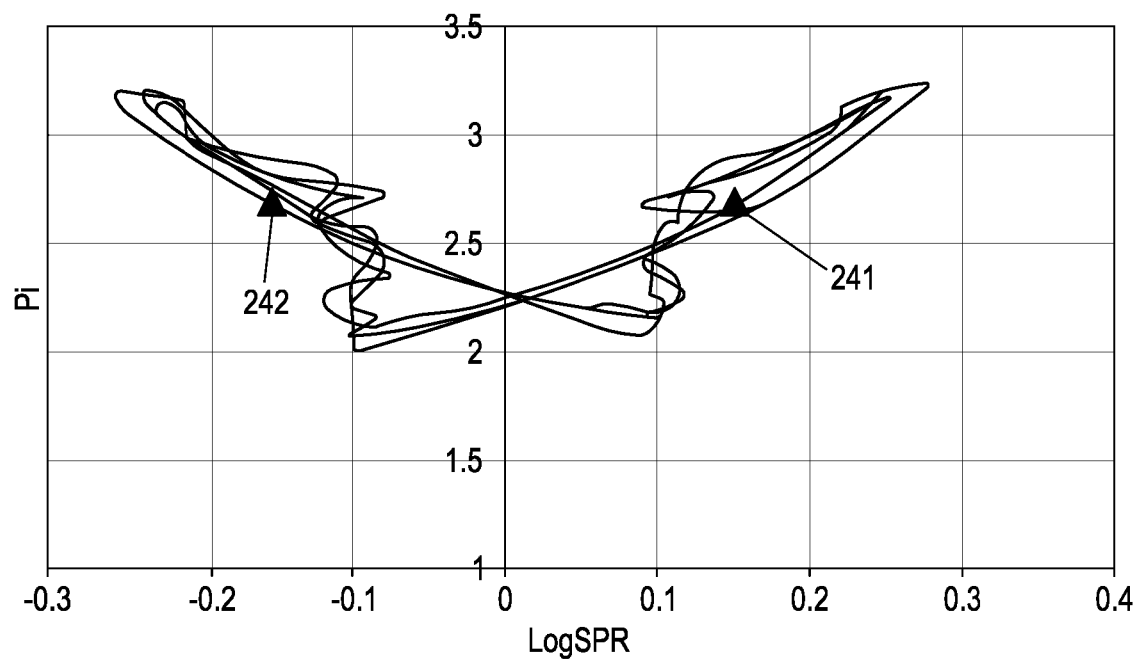
FIG. 12 illustrates two design points obtained by the embodiment.

FIG. 12 is the same as FIG. 5 but with the two candidate design points 241, 242 for the respective volutes 19a, 19b obtained by this process overlaid.

There is then a process of selecting one of the two candidate design points as the design point to be used in the design process of steps 104-107. One or more criteria can be used for this, such as the candidate design point for which the isentropic power is highest. Alternatively, the embodiment may determine which of the two candidate design points the locus of FIG. 5 is closest to for the greatest proportion of the engine cycle period.

In step 103 a determination is made of whether the design point (i.e. the selected candidate design point) exhibits one or more criteria indicating that equal flow predominates. For example, the design point may have an isentropic power weighted mean SPR with an absolute value less than a predetermined threshold. If the one or more criteria are met, then the turbine may be designed by a conventional method which does not take into account the design point obtained in step 102. This possibility is not illustrated in FIG. 6.

However, if the one or more criteria are not met, the turbine is designed by the process of steps 104-107 using the design point to select parameters of the turbine.

Step 104 is a first design step, based on the design points. This step may be performed using a known optimisation process which is familiar to turbine designers, to optimise the design of the wheel and/or housing subject to the design point. The shape of both the gas inlet volutes is modified during the optimization process. The optimization process is carried out multiple times, each time using a different respective value of the ratio ($CA_{housing}/CA_{wheel}$) (i.e. a different respective reaction value), thereby generating multiple respective turbine designs.

Figure 13:
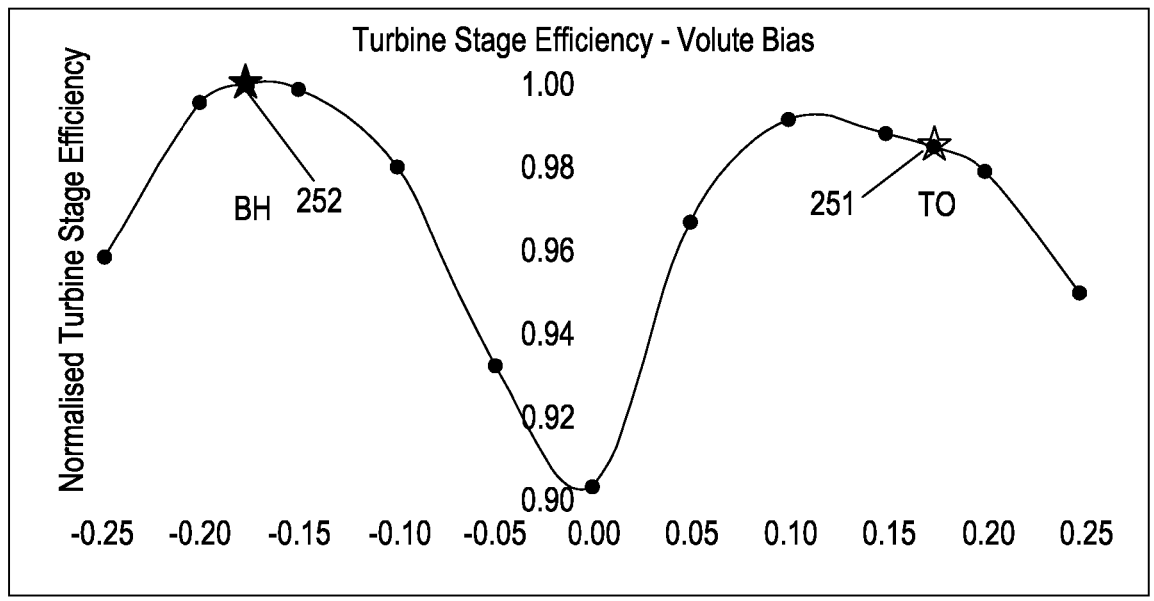
FIG. 13 is a plot of turbine stage efficiency against scroll pressure ratio for a candidate turbine design produced by the embodiment.

FIG. 13 illustrates the normalised turbine stage efficiency for different values of $\log_{10}$ (SṖR) for a turbine produced by the design step 104, when the candidate design point 242 of FIG. 12 is selected as the design point. The point 252 is the point on the turbine efficiency curve which has the same $\log_{10}$ (SṖR) value as the design point 242. The point 251 indicates the efficiency of the turbine produced by the design step 104 at the "inverse design point", i.e. it has a $\log_{10}$ (SṖR) value which is the negative of the $\log_{10}$ (SṖR) value at the design point 242. The turbine efficiency for point 252 is higher than for point 251.

Figure 14:
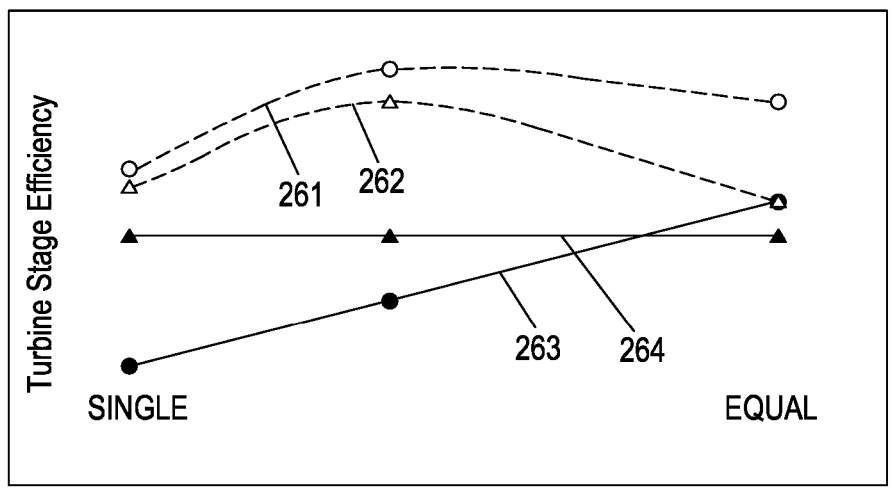
FIG. 14 shows the turbine stage efficiency of turbines designed by the embodiment for different reaction values.

FIG. 14 is a plot of the turbine stage efficiency, versus mass flow rate of two turbines designed in step 104. The horizontal axis indicates the degree of asymmetry in the pressures $P_{3,1}$ and $P_{3,2}$, with the left of the figure indicating that gas only enters the turbine through a single volute, and the right of the figure indicating that the pressures $P_{3,1}$ and $P_{3,2}$ are equal. Points on the horizontal axis between these extremes are partial admission.

The curve for a relatively low value of reaction is shown as line 261, and the curve for a relatively high value is shown as line 262. For comparison, FIG. 14 also includes corresponding lines illustrating the turbine stage efficiency which would be obtained in the case of a turbine which is designed by a known design method assuming equal admission, for a relatively low value of reaction (line 263) and a relatively high reaction (line 264). It will be seen that designing the turbine taking into account the partial admission improves the efficiency over the whole of the range. It will also be seen that whereas, for the turbine designed assuming equal admission, a low reaction has higher efficiency when the flow is equal in the two volutes, and a high reaction has higher efficiency when the mass flow is in a single volute, in the case that the design of the turbine is optimized for partial admission, it is found to be always better to have a low reaction. In a conventional design process, because line 264 is above line 263 for most levels of asymmetry, it is typical to choose the reaction to take a high value. By contrast, the design process of method 100 suggests using a lower reaction.

Figure 15:
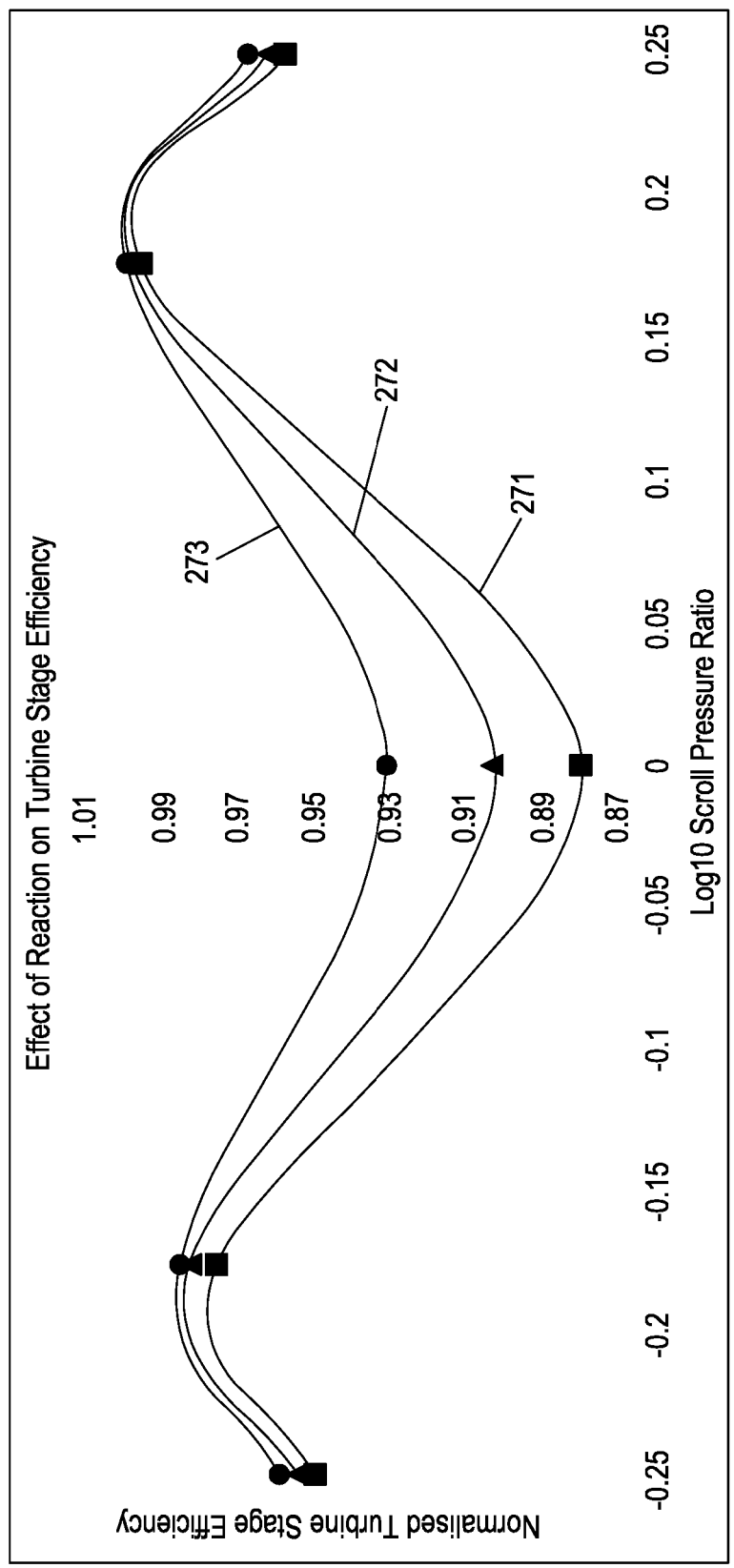
FIG. 15 illustrates the effect of reaction on turbine stage efficiency in a turbine designed by the embodiment.

In step 105, the distribution of turbine efficiency for each of the turbine designs obtained in step 104, is calculated. From the result, an optimal reaction value for a turbine for the real engine is selected. FIG. 15 shows a plot of the normalised turbine efficiency, for respective values of $\log_{10}$ (SṖR), for three turbines generated in step 104 using different respective values of reaction. Line 271 illustrates the efficiency of a turbine generated using a reaction value of 1.1. Line 272 illustrates the efficiency of a turbine generated using a reaction value of 1.0. Line 273 illustrates the efficiency of turbine generated using a reaction value of 0.9. Thus, a reaction value of 0.9 is found to be superior to the other two values for this engine. Surprisingly, the curve 273 has a higher efficiency than the lines 271, 272 for all values of $\log_{10}$ (SṖR), although it might have been expected only to have higher efficiency near the design points.

In step 106, using the reaction selected in step 105, the critical areas of the wheel and housing are calculated. This is done using the selected reaction and another assumed constraint, such as a total mass flow associated with the real internal combustion engine (e.g. specified by a manufacturer of the engine).

In step 107, an optional further design step is carried out using the design point and the critical areas obtained in step 106, to obtain a final turbine design. This optimization step can be carried out using the same optimisation process as used in step 104. Note that if the optimal reaction value selected at step 105 is one of the reaction values used in step 104, then step 107 can be omitted. That is, the corresponding one of the candidate turbine designs produced in step 104 can be used as the final turbine design.

In step 108, a turbo-charger including a turbine according to the final turbine design is produced (manufactured). This can be done using a conventional manufacturing process, such as casting.

The explanation of the embodiment above includes an explanation of how representative operating points 241, 242 are obtained in the embodiment. Brinkert et al, "*Konsequente Weiterentwicklung von Stoss-/Stauaufladung am 4-Zylinder Ottomotor*", Dresden Supercharging Conference 2014 also describes a process for obtaining average operating points from pulsatile turbine data. However, this method does not employ isentropic power weighted points, does not involve a filtration of the design points, and is believed to be inferior. Nor does this reference disclose a use for the average operating points.

Although only a single embodiment of the disclosure has been described in detail, many variations are possible within the scope of the disclosure defined by the appended claims. For example, in a variant the embodiment, SPR may instead be defined as the reciprocal of the right side of Eqn. (2).

In a further variant, rather than using the isentropic powers associated with the respective data points to obtain isentropic-power weighted means, it would alternatively be possible to use the isentropic power in other ways, e.g. to filter out data points for which the isentropic power is less than a threshold (e.g. a certain proportion of its maximum value), and to obtain the design points using the remaining data points.

Furthermore, in other variants of the embodiment, the method of FIG. 6 may be carried out while obtaining the design point in step 102 in a different manner, e.g. as a weighted point which is not an isentropic weighted mean.

Furthermore, embodiments are possible in which the designed turbine is not a twin-type (in which both gas input volutes 19a, 19b enter the wheel chamber at the same rotational position about the axis 2 of the turbine wheel), but instead are of a type in which the volutes open into the wheel chamber at angular positions which are spaced from other by a 180 rotation about the rotational axis 2 of the wheel.

The invention claimed is:

1. A method for determining at least one design parameter of a turbine for an internal combustion engine, the turbine including a pair of gas inlet volutes for transmitting exhaust gas emitted by respective groups of one or more cylinders of the engine to a chamber of the turbine which houses a turbine wheel, the exhaust gas entering a first of the volutes having a different pressure waveform from a pressure waveform of the exhaust gas entering a second of the volutes, and the two pressure waveforms being out of phase, the method including:

obtaining time series data as data points indicating the available turbine power at each gas inlet volute at each of a plurality of respective times during an engine cycle;

obtaining an isentropic power value associated with each data point;

obtaining a design point from the time series data and the corresponding isentropic power values; and selecting the at least one design parameter to maximise power efficiency at the design point.

2. A method according to claim 1 in which the design point is obtained based on at least one of an isentropic-power weighted mean turbine expansion ratio, and an isentropic-power weighted mean scroll pressure ratio.

3. A method according to claim 1 in which a respective candidate design point is obtained for each volute, and the design point is obtained by selecting from the candidate design points.

4. A method according to claim 1 in which the design point is obtained using a sub-set of the time series data, the sub-set of the time series data being obtained by deriving a respective scroll pressure ratio for each of a number of data points of the time series data, and filtering the data points of the time series data using the respective scroll pressure ratio.

5. A method according to claim 4, in which a respective candidate design point is obtained for each volute from isentropic data points for a portion of the engine cycle in which the pressure in the respective volute is greater than in the other volute, and the design point is obtained by selecting from the candidate design points.

6. A method according to claim 1, in which there is at least one design parameter for each respective volute which is chosen using the design point.

7. A method according to claim 1, in which the selecting the at least one design parameter includes:

a first step of, for a plurality of reaction values indicative of the ratio of a critical area of the turbine housing and a critical area of the turbine wheel, generating corresponding initial parameters of the turbine based on the design point; and from the initial parameters, choosing a reaction value.

8. A method according to claim 7, further including a second design step of generating parameters of the turbine based on the design point for the chosen reaction value.

9. A method of determining at least one design parameter of a turbine for an internal combustion engine, the turbine including a pair of volutes for transmitting exhaust gas emitted by respective groups of one of more cylinders of the engine to a chamber of the turbine which houses a turbine wheel, the exhaust gas entering a first of the volutes having a different pressure waveform from a pressure waveform of the exhaust gas entering a second of the volutes, and the two pressure waveforms being out of phase, the method including:

obtaining time series data as data points indicative of the available turbine power at each gas inlet volute over an engine cycle;

using the time series points to obtain a design point;

a first design step of, for a plurality of reaction values indicative the ratio of a critical area of the turbine housing and a critical area of the turbine wheel, generating corresponding initial parameters of the turbine based on the design point; and from the initial parameters, choosing a reaction value, the at least one design parameter being a design parameter of a turbine having the chosen reaction value.

10. A method according to claim 9, further including
a second design step of generating parameters of the turbine based on the design point for the chosen reaction value.

11. A method for producing a turbine for an internal combustion engine, comprising:
determining at least one design parameter of the turbine, the turbine including a pair of gas inlet volutes for transmitting exhaust gas emitted by respective groups of one of more cylinders of the engine to a chamber of the turbine which houses a turbine wheel, the exhaust gas entering a first of the volutes having different a pressure waveform from the pressure waveform of the exhaust gas entering the other volute, and the two pressure waveforms being out of phase, the determination of the at least design parameter including:
(i) obtaining time series data as data points indicating the available turbine power at each gas inlet volute at each of a plurality of respective times during an engine cycle;
(ii) obtaining an isentropic power value associated with each data point;
(iii) obtaining a design point from the time series data and the corresponding isentropic power values; and
(iv) selecting the at least one design parameter to maximise power efficiency at the design point; and
forming a turbine which exhibits the determined design parameter.

\* \* \* \* \*